United States Patent
Lu et al.

(10) Patent No.: US 9,490,409 B2
(45) Date of Patent: Nov. 8, 2016

(54) LIGHT EMMITING DIODE CHIP

(71) Applicant: Formosa Epitaxy Incorporation, Taoyuan County (TW)

(72) Inventors: Chih-Hsuan Lu, Taoyuan County (TW); Yu-Yun Chen, Taoyuan County (TW); Yung-Hsin Lin, Taoyuan County (TW); Fang-I Li, Taoyuan County (TW); Shyi-Ming Pan, Taoyuan County (TW)

(73) Assignee: FORMOSA EPITAXY INCORPORATION, Taoyuan County (TW)

( * ) Notice: Subject to any disclaimer, the term of this patent is extended or adjusted under 35 U.S.C. 154(b) by 0 days.

(21) Appl. No.: 14/490,682

(22) Filed: Sep. 19, 2014

(65) Prior Publication Data
US 2015/0008475 A1   Jan. 8, 2015

Related U.S. Application Data

(63) Continuation-in-part of application No. 13/655,534, filed on Oct. 19, 2012, now Pat. No. 8,933,469.

(60) Provisional application No. 61/944,061, filed on Feb. 25, 2014.

(30) Foreign Application Priority Data

Oct. 24, 2011 (TW) .............................. 100138435 A

(51) Int. Cl.
*H01L 33/00* (2010.01)
*H01L 33/62* (2010.01)
(Continued)

(52) U.S. Cl.
CPC .............. *H01L 33/62* (2013.01); *H01L 24/05* (2013.01); *H01L 24/06* (2013.01); *H01L 33/38* (2013.01);
(Continued)

(58) Field of Classification Search
CPC ....... H01L 33/58; H01L 33/62; H01L 24/05; H01L 24/06; H01L 33/38; H01L 33/42; H01L 33/46
USPC ...................... 257/88, 89, E33.062, E33.072
See application file for complete search history.

(56) References Cited

U.S. PATENT DOCUMENTS

| 7,112,825 B2 * | 9/2006 | Shakuda et al. ................. 257/99 |
| 2007/0145381 A1 * | 6/2007 | Unno et al. ..................... 257/79 |
| 2014/0124730 A1 * | 5/2014 | Choi ....................... H01L 33/10 257/13 |

FOREIGN PATENT DOCUMENTS

TW          201349537          12/2013

OTHER PUBLICATIONS

"Office Action of Taiwan Counterpart Application", issued on Sep. 22, 2015, p. 1-p. 4.

*Primary Examiner* — Hung Vu
(74) *Attorney, Agent, or Firm* — Muncy, Geissler, Olds & Lowe, P.C.

(57) ABSTRACT

A light emitting diode (LED) chip including a first type semiconductor layer, an light-emitting layer, a second type semiconductor layer, a current blocking layer, a transparent conductive layer and an electrode is provided. The light-emitting layer is disposed on the first type semiconductor layer. The second type semiconductor layer is disposed on the light-emitting layer. The current blocking layer is disposed on the second type semiconductor layer. The transparent conductive layer is disposed on the second type semiconductor layer and covered the current blocking layer. The electrode is disposed on the transparent conductive layer corresponding to the current blocking layer. The current blocking layer and the electrode respectively have a first width and a second width in a cross section view, and the first width of the current blocking layer is larger than the second width of the electrode.

14 Claims, 13 Drawing Sheets

(51) Int. Cl.
  *H01L 33/42* (2010.01)
  *H01L 33/46* (2010.01)
  *H01L 33/38* (2010.01)
  *H01L 23/00* (2006.01)
  H01L 25/075 (2006.01)
  H01L 33/44 (2010.01)

(52) U.S. Cl.
  CPC ............... *H01L 33/42* (2013.01); *H01L 33/46* (2013.01); *H01L 24/45* (2013.01); *H01L 24/48* (2013.01); *H01L 25/0753* (2013.01); *H01L 33/44* (2013.01); *H01L 2224/04042* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/05673* (2013.01); *H01L 2224/06102* (2013.01); *H01L 2224/451* (2013.01); *H01L 2224/48091* (2013.01); *H01L 2224/48137* (2013.01); *H01L 2224/48227* (2013.01); *H01L 2224/49107* (2013.01); *H01L 2924/12041* (2013.01); *H01L 2924/3025* (2013.01)

LIGHT EMMITING DIODE CHIP

CROSS-REFERENCE TO RELATED APPLICATION

This application is a continuation-in-part application of and claims the priority benefit of a prior application Ser. No. 13/655,534, filed on Oct. 19, 2012, now pending. The prior application Ser. No. 13/655,534 claims the priority benefit of Taiwan application serial no. 100138435, filed on Oct. 24, 2011. This application also claims the priority benefits of U.S. provisional application Ser. No. 61/944,061, filed on Feb. 25, 2014. The entirety of each of the above-mentioned patent applications is hereby incorporated by reference herein and made a part of this specification.

BACKGROUND OF THE INVENTION

1. Field of the Invention

The invention relates to a light-emitting device and more particularly relates to a light-emitting diode chip having a current blocking layer.

2. Description of Related Art

Due to the recent gradual decrease in fossil energy, and consequently the growing demand for energy-saving products, the light-emitting diode (LED) technology has made significant progress.

Under conditions of instability of the oil price, many countries around the world have actively engaged in development of energy-saving products, and the application of light-emitting diodes in energy-saving bulbs is a product of this trend.

In addition, with the advancement of light-emitting diode technology, applications of white or other color (blue, for example) light-emitting diodes get more widespread.

As the light-emitting diode technology matures over time, there are more and more applicable areas. The applications of light-emitting diodes to lighting includes residential areas: wall lamps, nightlights (the earliest field for using light-emitting diode as light source due to low requirement for brightness) auxiliary lights, garden lights, reading lights; utility areas: emergency lights, hospital bed lights; business areas: spotlights, downlights, light bars; outdoor areas: building exteriors, solar lights; and light shows, etc.

In addition to advantages of light-emitting diodes such as low power consumption, mercury free, long life, and low carbon dioxide emissions, the environmental policy of governments around the world banning the use of mercury has also encouraged researchers to delve into R & D and application of white light-emitting diodes. While the global trend of environmental protection rises, the light-emitting diode regarded as a green light source is in line with global mainstream trends. As pointed out previously, it has been widely used in 3C product indicators and display devices; also with the increase in production yield of light-emitting diodes, unit manufacturing costs have been greatly reduced, therefore demand for light-emitting diodes keeps increasing.

As described above, the development of high-brightness light-emitting diodes has become the focus of research and development of companies around the world at this moment; however, current light-emitting diodes are still flawed in application design, so that it is hard for the luminous efficiency to be optimal.

SUMMARY OF THE INVENTION

The invention provides a LED chip, capable of enhancing the luminous efficiency of the LED chip.

The LED chip of the invention includes a first type semiconductor layer, an light-emitting layer, a second type semiconductor layer, a current blocking layer, a transparent conductive layer and an electrode. The light-emitting layer is disposed on the first type semiconductor layer. The second type semiconductor layer is disposed on the light-emitting layer. The current blocking layer is disposed on the second type semiconductor layer. The transparent conductive layer is disposed on the second type semiconductor layer and covered the current blocking layer. The electrode is disposed on the transparent conductive layer corresponding to the current blocking layer. The current blocking layer and the electrode respectively have a first width and a second width in a cross section view, and the first width of the current blocking layer is larger than the second width of the electrode.

In an embodiment of the invention, the ratio of the first width to the second width ranges from 1.4 to 2.6.

In an embodiment of the invention, the current blocking layer includes a plurality of high refractive index layers and a plurality of low refractive index layers, and the high refractive index layers and the low refractive index layers are alternately stacked.

In an embodiment of the invention, the high refractive index layers include a first high refractive index layer and a second high refractive index layer, and the low refractive index layers include a low refractive index bottom layer, a first low refractive index layer and a second low refractive index layer. The low refractive index bottom layer is disposed between the second type semiconductor layer and the first high refractive index layer. The first low refractive index layer is disposed between the first high refractive index layer and the second high refractive index layer. The second low refractive index layer is disposed between the second high refractive index layer and the transparent conductive layer.

In an embodiment of the invention, the thickness of the low refractive index bottom layer is larger than the other refractive index layer.

In an embodiment of the invention, the thicknesses of the high refractive index layers are $0.25\lambda/n_h$, the thicknesses of the first low refractive index layer and the second low refractive index layer are $0.25\lambda/n_l$, the thicknesses of the low refractive index bottom layer is $1.75\lambda/n_l$, where $\lambda$ is wavelength of a light emitted from the light-emitting layer, $n_l$ is a refractive index of the low refractive index layers, and $n_h$ is a refractive index of the high refractive index layer.

In an embodiment of the invention, the high refractive index layers further comprise a high refractive index top layer disposed between the second low refractive index layer and the transparent conductive layer.

In an embodiment of the invention, the thicknesses of the high refractive index layers and the high refractive index top layer are $0.15\lambda/n_h$, the thicknesses of the first low refractive index layer and the second low refractive index layer are $0.45\lambda/n_l$, the thicknesses of the low refractive index bottom layer is $0.6\lambda/n_l$, where $\lambda$ is wavelength of a light emitted from the light-emitting layer, $n_l$ is a refractive index of the low refractive index layers, and $n_h$ is a refractive index of the high refractive index layer.

In an embodiment of the invention, a material of the high refractive index layers include titanium dioxide ($TiO_2$).

In an embodiment of the invention, a material of the low refractive index layers include silicon dioxide ($SiO_2$).

In an embodiment of the invention, a material of transparent conductive layer includes an element selected from a group consisting of indium-tin oxide (ITO), zinc oxide (ZnO), indium-gallium oxide (IGO), aluminium doped zinc oxide (AZO), nickel oxide (NiO), ruthenium dioxide ($RuO_2$), and graphene.

Based on the above, the LED chip of the invention could cause that the reflectivity of the light incident toward the second electrode with a small incident angle and the transmittance of the light propagating toward the neighborhood of the second electrode would be optimized by adjusting the arrangement and thickness of each of a plurality of high refractive index layers and a plurality of low refractive index layers so as to enhance the light extracting efficiency or the luminous efficiency of the LED chip.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

In practical applications, light-emitting diodes are often combined as light-emitting diode array modules, which arrange a large number of light-emitting diode chips on the substrate and obtain a better light-emitting effect by taking advantage of quantity. However, such a way of arranging light-emitting diode chips, in addition to problems of cooling that occur most frequently, how to further enhance the light-output efficiency is the subject that we should face and think about in this field.

Figure 1:
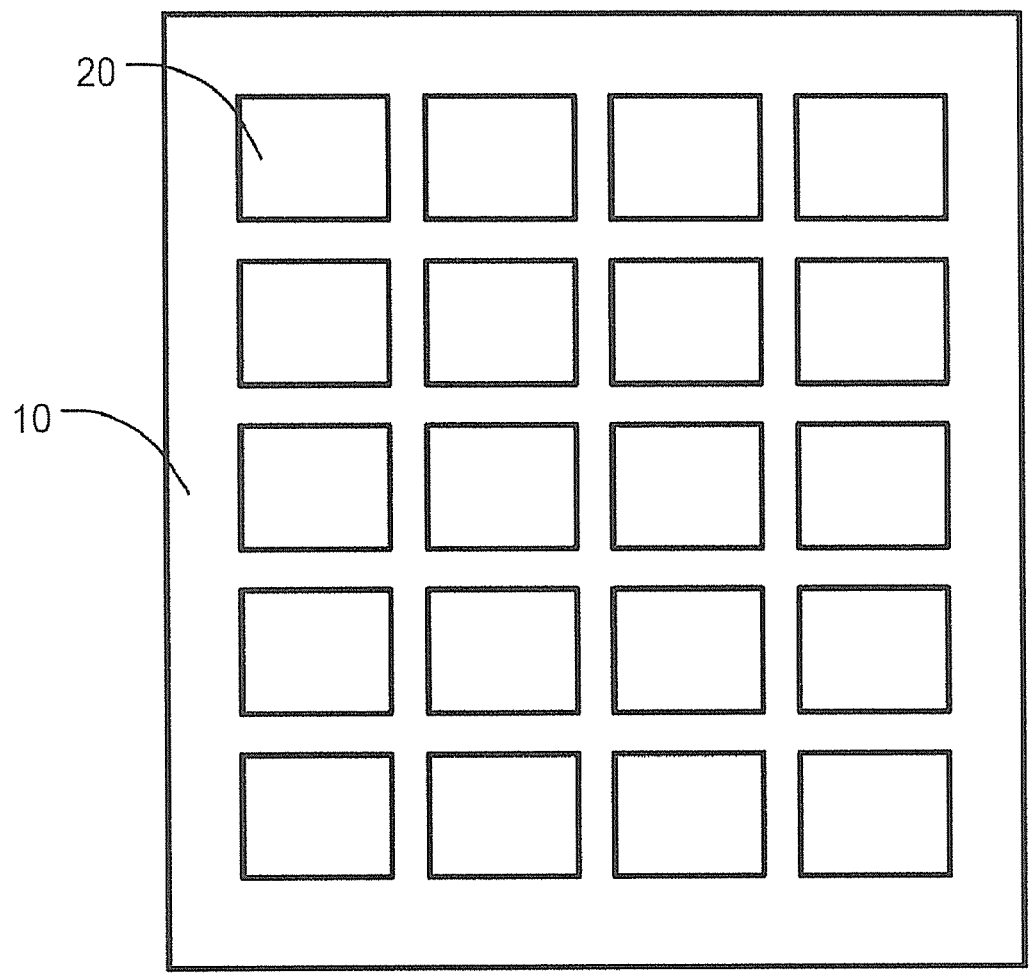
FIG. 1 shows a schematic diagram of the structure of the prior art.

In the prior technologies, as shown in FIG. 1, light-emitting diode chips are arranged side by side on a large substrate, and connected to one another by wire bonding to form a light-emitting matrix. FIG. 1 includes a substrate 10 and a plurality of light-emitting diode chips 20; the light-emitting diode chips 20 align neatly in the form of a matrix. In this arrangement, except light emitting from top surface of chips and the light-emitting diode chips 20 at four corners having two sides that light output there from without being shielded, the rest of light emitting from side walls of the light-emitting diode chips 20 are mutually shielded by adjacent chip; as a result, light output from sides around the chip is undoubtedly a waste and lighting efficiency of the light-emitting matrix is low.

Figure 2:
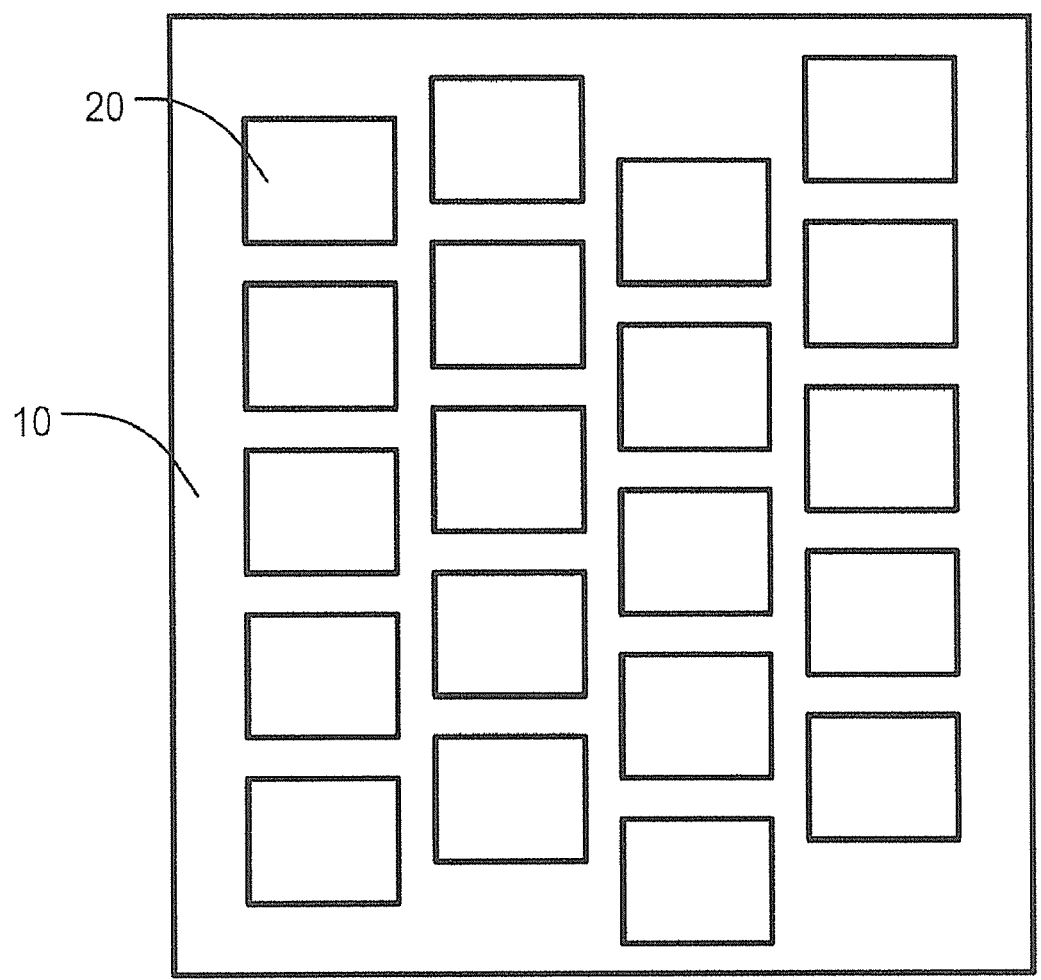
FIG. 2 shows a schematic diagram of the structure according to a preferred embodiment of the present invention.
Figure 3:
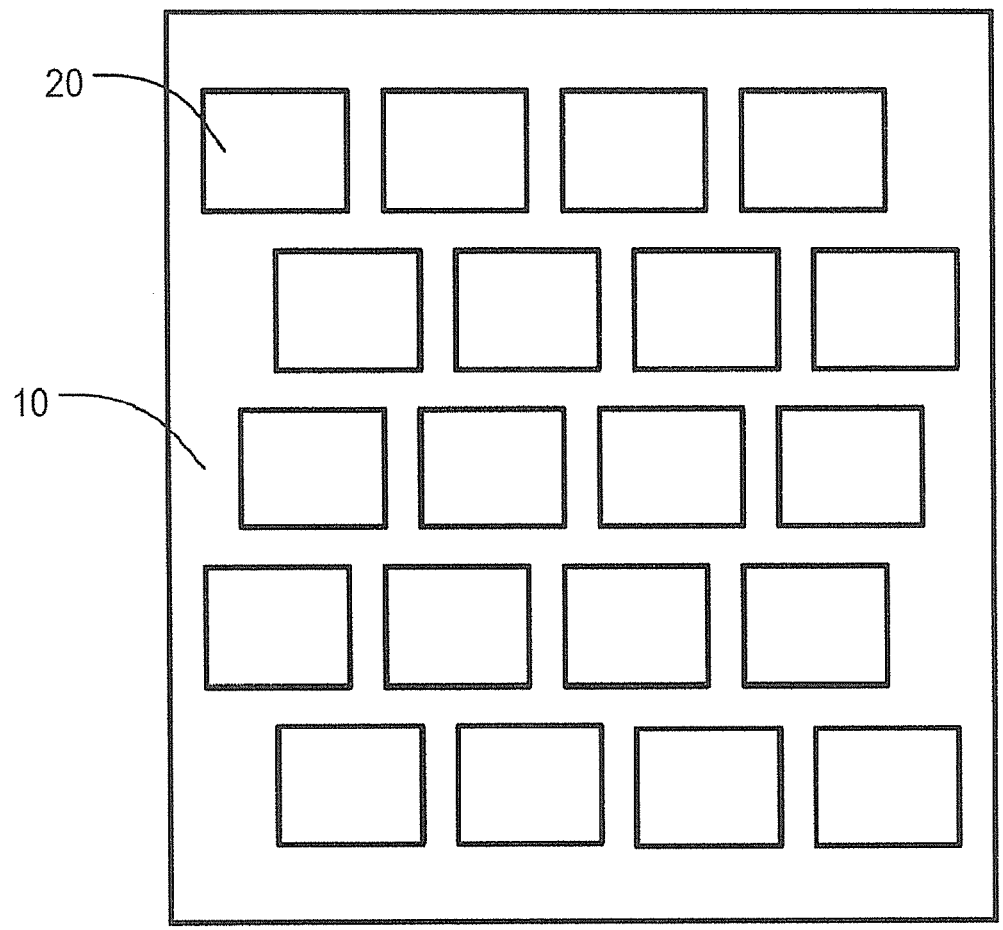
FIG. 3 shows a schematic diagram of the structure according to a preferred embodiment of the present invention.

Refer to FIG. 2 and FIG. 3, which shows a schematic diagram of the structure according to a preferred embodiment of the present invention. As shown in the in FIG. 2 and FIG. 3, the high-voltage light-emitting device In the invention comprises a substrate 10 and a set of light-emitting diode chips 20.

Wherein, the set of light-emitting diode chips 20 are located on the substrate 10 and have a number of 18 to 25; in addition, the light-emitting diode chips 20 have an interleaved or staggered arrangement that each of the light-emitting diode chips 20 is not aligned or mis-aligned with adjacent one, therefore the periphery of overall light-emitting diode chips 20 takes a form of staggered regular or irregular zigzag, as a non-matrix arrangement. Under this arrangement, in addition to light output from the top surface of the light-emitting diode chips 20 which occupied about 60% to 80% area of the substrate 10 can output light well, light output from the sides of the light-emitting diode chips 20 can also be used.

Comparing FIG. 2 and FIG. 3 with FIG. 1, it is clearly understood that the present invention enhances the efficiency by adjusting the arrangement of the light-emitting diode chips 20 in order to achieve the best lighting efficiency for the same production costs.

Figure 4:
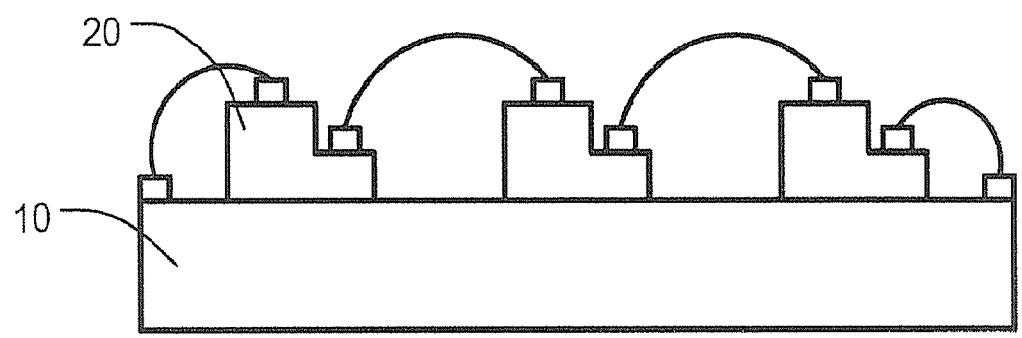
FIG. 4 shows a cross-section view of the structure according to a preferred embodiment of the present invention.

In the invention, the light-emitting diode chips 20 are connected in series. Refer to FIG. 4, which shows a cross-section view of the structure according to a preferred embodiment of the present invention. As shown in the FIG. 4, the light-emitting diode chips 20 are spread on the substrate 10 and electrically connected to one another in series by bonding metal wires. Because the voltage of each of the light-emitting diode chips 20 is about 3.1 to 3.5 volts and the number of chips of a set is about 18 to 25, the total driving voltage of the light emitting device having a set of light-emitting diode chips In the invention is about 55.8 to 87.5 volts when the chips are connected in series, though it is suggested that the voltage had better keep within the range from 70 to 75 volts which is a more appropriate voltage range. And in addition to connect in series, light emitting chips 20 can also be connected in parallel or series-parallel depending on the voltage requirement of the light emitting device.

Figure 5:
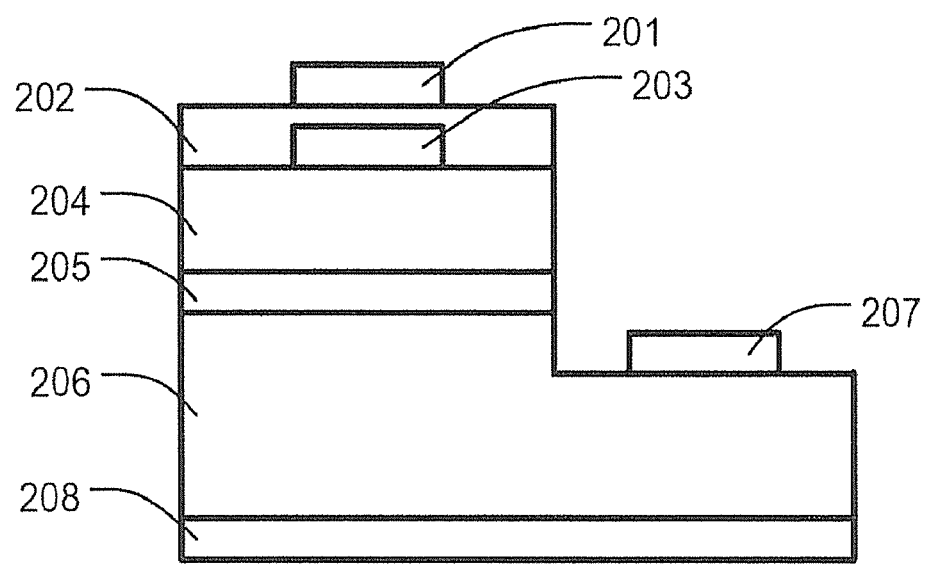
FIG. 5 shows a cross-section view of the light-emitting diode chip according to a preferred embodiment of the present invention.

In addition to the embodiment described above, the present invention also discloses a light-output structure regarding to a light-emitting diode chip. Please refer to FIG. 5, which shows a cross-section view of one of the light-emitting diode chips 20 according to a preferred embodiment of the present invention. As shown in the FIG. 5, the light-emitting diode chip comprises a non-transparent P-type electrode 201; a transparent conductive layer 202; a current blocking layer 203; a P-type semiconductor layer 204; a light-emitting layer 205; an N-type electrode 207; an N-type semiconductor layer 206; and an optical reflection layer 208.

Wherein, the optical reflection layer 208 is located above the substrate 10, as well as at the bottom of the light-emitting diode chip; the N-type semiconductor layer 206 is located above the optical reflection layer 208; the N-type electrode 207 is located above the N-type semiconductor layer 206; the light-emitting layer 205 is also located above the N-type semiconductor layer 206, but not connected with the N-type electrode 207; the P-type semiconductor layer 204 is located above the light-emitting layer 205; the transparent conductive layer 202 is located above the P-type semiconductor layer 204, as well as on the top of the light-emitting diode chip; in addition, the current blocking layer 203 within the transparent conductive layer 202 is located above the P-type semiconductor layer 204; the P-type electrode 201 is located above the transparent conductive layer 202.

Based on the structure of the light-emitting diode chip, the light generated by the light-emitting layer 205 toward the bottom of the chip has been reflected to the correct light-output direction, which is upward from the light-emitting diode chip by the reflection of the optical reflection layer 208.

Because the current direction of the general light-emitting diode is the shortest path, most of the current injects into the region below the non-transparent P-type electrode 201, and then generating most of the light below the P-type electrode 201 which shielded the light, eventually resulting in reduction of light output efficiency. Therefore, the current blocking layer 203 can be used to spread the current direction away from the electrode 201 and improve the light emitting efficiency. The manufacture method of this kind of structure uses chemical vapor deposition and etching to deposit insulators into the device structure for the purpose of blocking the shortest path, so as to make the current of the light-emitting diode chip travel other paths and thus enhance the brightness or light emitting efficiency of the light-emitting diode chip.

Figure 6:
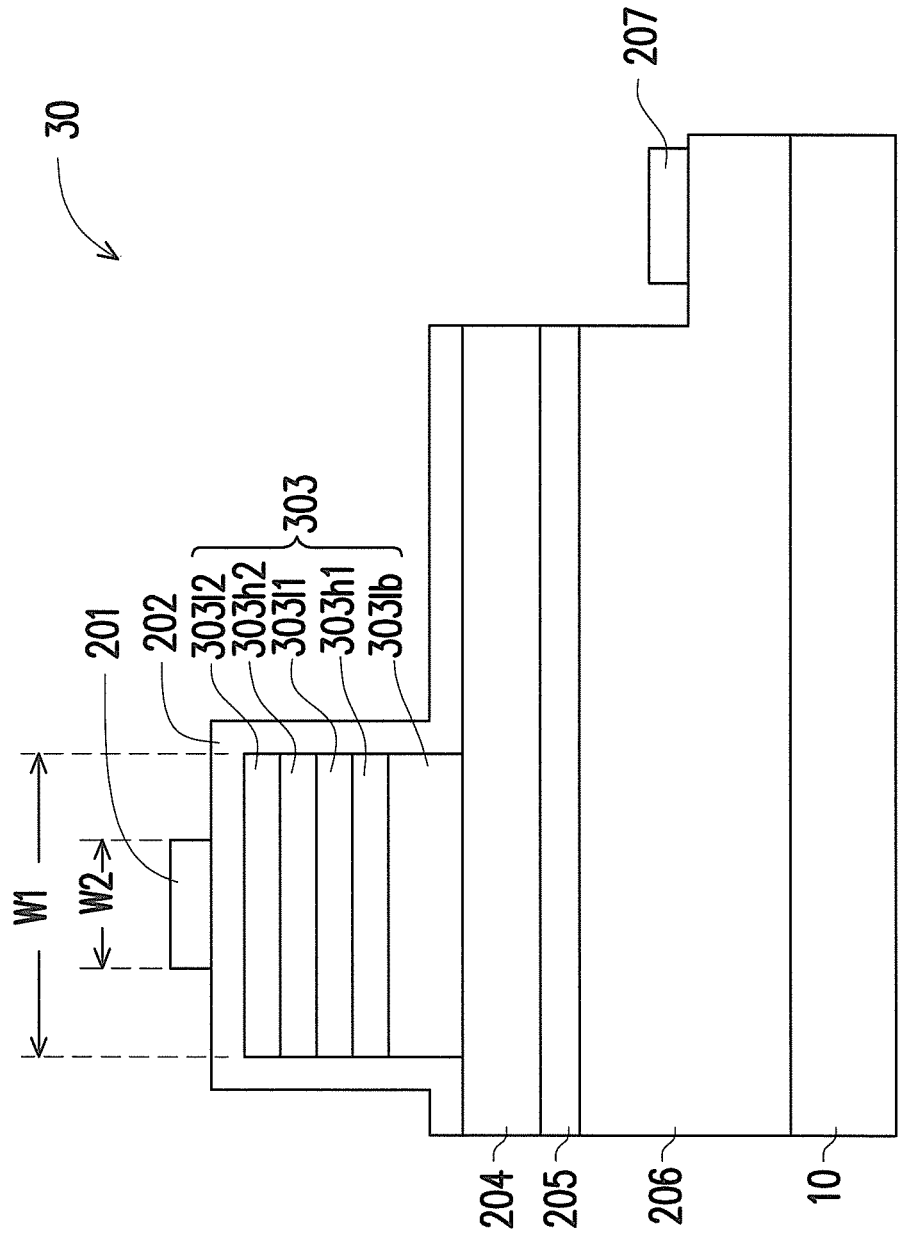
FIG. 6 shows a cross-section view of the light-emitting diode chip according to another preferred embodiment of the present invention.

Refer to FIG. 6, which shows a cross-section view of the light-emitting diode chip according to another preferred embodiment of the invention. As shown in the FIG. 6, the LED chip 30 of the embodiment includes a N-type semiconductor layer 206, an light-emitting layer 205, a P-type semiconductor layer 204, a current blocking layer 303, a transparent conductive layer 202, a N-type electrode 207 and a P-type electrode 201. The light-emitting layer 205 is disposed on the N-type semiconductor layer 206. The P-type semiconductor layer 204 is disposed on the light-emitting layer 205. The current blocking layer 303 is disposed on the P-type semiconductor layer 204. The transparent conductive layer 202 is disposed on the P-type semiconductor layer 204 and covered the current blocking layer 303. The N-type electrode 207 is located above the N-type semiconductor layer 206 and the P-type electrode 201 is disposed on the transparent conductive layer 202 corresponding to the current blocking layer 303. For example, in the present embodiment, a material of transparent conductive layer 202 includes an element selected from a group consisting of indium-tin oxide (ITO), zinc oxide (ZnO), indium-gallium oxide (IGO), aluminium doped zinc oxide (AZO), nickel oxide (NiO), ruthenium dioxide ($RuO_2$), and graphene. Besides, in the present embodiment, a material of the electrodes 201, 207 includes an element selected from a group consisting of metal such as Ag, Al, Au, Rh, Pt, Pd, Ni, Cr, Cu, Ti, and compound metal such as AlCu, AlSiCu, AgAl, NiAg.

In detail, in the present embodiment, the current blocking layer 303 includes a plurality of high refractive index layers 303$h$1, 303$h$2 and a plurality of low refractive index layers 303$lb$, 303$l$1 and 303$l$2, wherein the high refractive index layers 303$h$1, 303$h$2 and the low refractive index layers 303$lb$, 303$l$1 and 303$l$2 are alternately stacked. In this way, the current blocking layer 303 could form a distributed Bragg reflector (DBR) through the alternately stacked the high refractive index layers 303$h$1, 303$h$2 and the low refractive index layers 303$lb$, 303$l$1 and 303$l$2 to reflect the light emitted from the light-emitting layer 205.

Further, the high refractive index layers 303$h$1, 303$h$2 include a first high refractive index layer 303$h$1 and a second high refractive index layer 303$h$2, and the low refractive index layers 303$lb$, 303$l$1 and 303$l$2 include a low refractive index bottom layer 303$lb$, a first low refractive index layer 303$l$1 and a second low refractive index layer 303$l$2. The low refractive index bottom layer 303$lb$ is disposed between the P-type semiconductor layer 204 and the first high refractive index layer 303$h$1. The first low refractive index layer 303$l$1 is disposed between the first high refractive index layer 303$h$1 and the second high refractive index layer 303$h$2. The second low refractive index layer 303$l$2 is disposed between the second high refractive index layer 303$h$2 and the transparent conductive layer 202. In this way, the reflectivity of the light emitted from the light-emitting layer 205 could be enhanced through adjusting the thickness of each of a plurality of high refractive index layers 303$h$1, 303$h$2 and a plurality of low refractive index layers 303$lb$, 303$l$1 and 303$l$2.

For example, the thicknesses of the low refractive index bottom layer 303$lb$ is 1.75$\lambda/n_l$, the thicknesses of the high refractive index layers 303$h$1, 303$h$2 are 0.25$\lambda/n_h$, the thicknesses of the first low refractive index layer 303$l$1 and the second low refractive index layer 303$l$2 are 0.25$\lambda/n_l$, the thicknesses of the low refractive index bottom layer 303$lb$ is 1.75$\lambda/n_l$, where $\lambda$ is wavelength of a light emitted from the light-emitting layer 205, $n_l$ is a refractive index of the low refractive index layers, and $n_h$ is a refractive index of the high refractive index layers. In other words, in the present embodiment, the thickness of the low refractive index bottom layer 303$lb$ is larger than the other refractive index layer. By this configuring, part of the light emitted from the light-emitting layer 205 would be reflected by the current blocking layer 303 when incident to the current blocking layer 303, so as to enhance the light extracting efficiency of the LED chip 30. Further, in the case of using the LED chip 30 substantially, the light incident to the current blocking layer 303 with a incident angle about 37° or more would be reflected totally because of the difference between the refractive index of the P-type semiconductor layer 204 and the refractive index of the low refractive index bottom layer 303$lb$.

For example, in the present embodiment, the light emitted from the light-emitting layer 205 is a blue light, and its wavelength is about 450 nm. Moreover, a material of the high refractive index layers 303$h$1, 303$h$2 includes titanium dioxide ($TiO_2$) and its refractive index $n_h$ for the blue light is 2.81-2.82 when the incident light with a wavelength about 450 nm. A material of the low refractive index layers 303$lb$, 303$l$1 and 303$l$2 includes silicon dioxide ($SiO_2$) and its refractive index n1 is 1.45-1.49 when the incident light with a wavelength about 450 nm. It should be noticed that the aforementioned value ranges are only used as an example, and are not used for limiting the invention. Those skilled in the art can select the material with adapted refractive index according to the wavelength of the light emitted from the light-emitting layer 205 and the actual requirement, and details thereof are not repeated.

Figure 8:
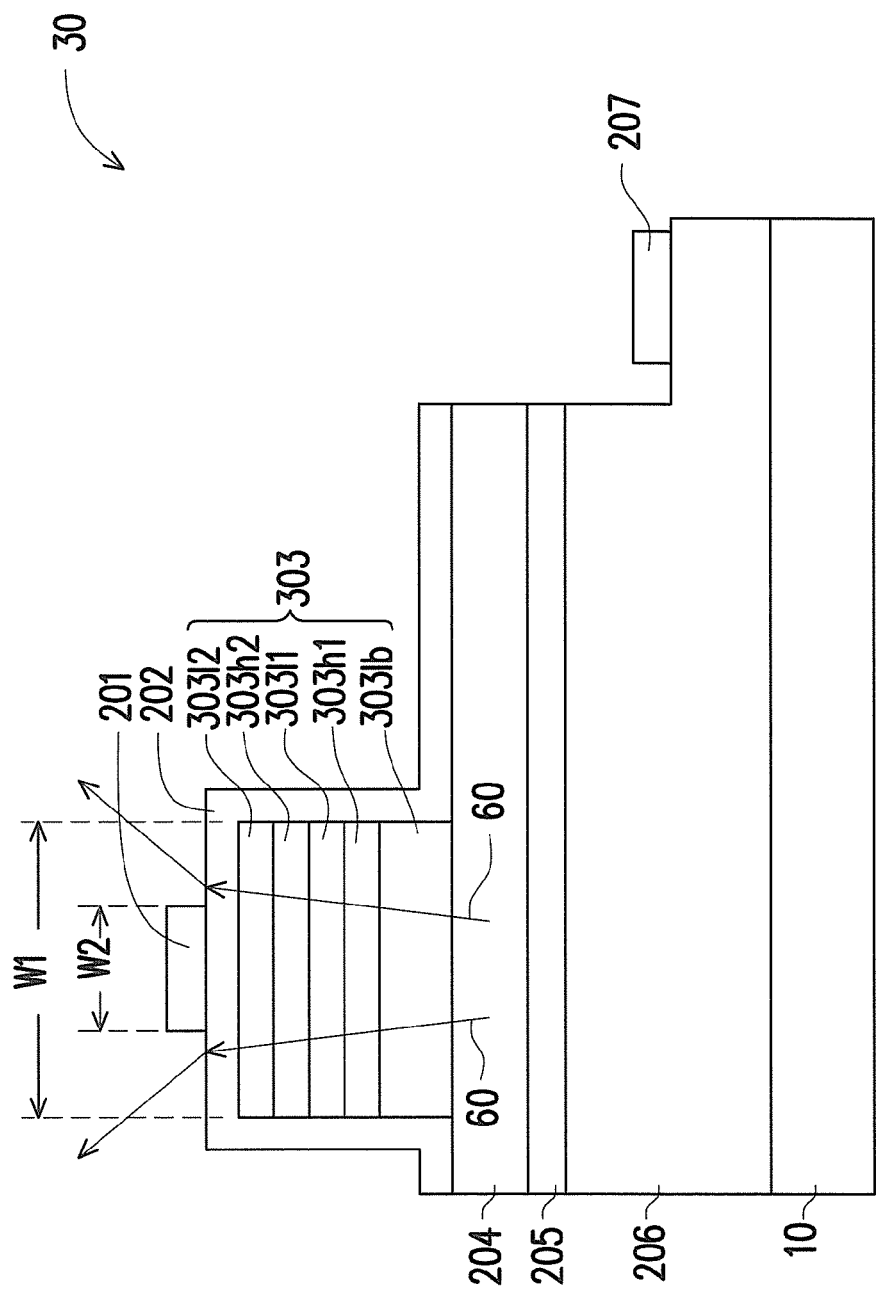
FIG. 8 shows another schematic view of light path of the light-emitting diode chip show in FIG. 6.
Figure 9:
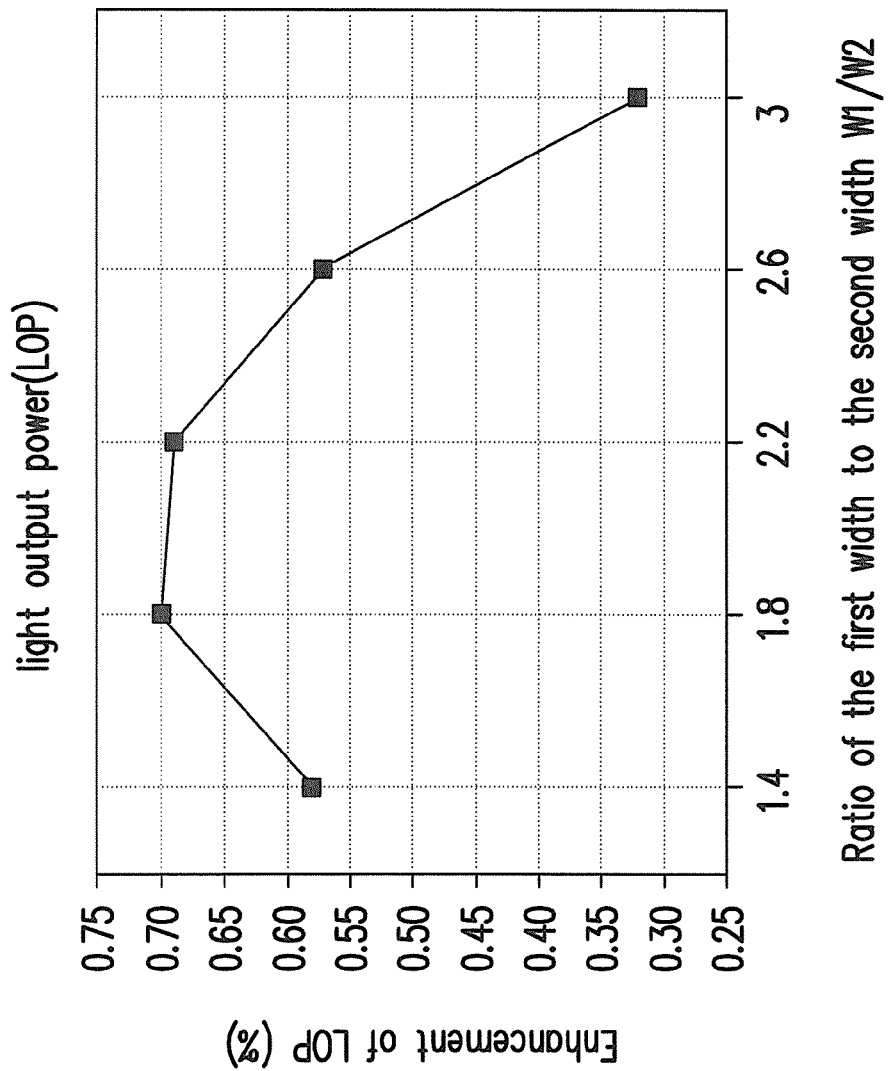
FIG. 9 is a ratio of the first width to the second width— enhancement of light output power (LOP) rate curve diagram of the light-emitting diode chip show in FIG. 6.

Besides, the current blocking layer 303 and the P-type electrode 201 respectively have a first width W1 and a second width W2 in a cross section view, and the first width W1 of the current blocking layer 303 is larger than the second width W2 of the P-type electrode 201. In details, the ratio (W1/W2) of the first width W1 to the second width W2 preferably ranges from 1.4 to 2.6. In this way, the light extracting efficiency, the luminous efficiency and the reliability of the LED chip 30 could be enhanced by configuring of the LED chip 30 in the present embodiment, as shown in FIG. 9. It should be noticed that the aforementioned value ranges are only used as an example, and are not used for limiting the invention. Details are described below with reference of FIG. 7 to FIG. 10.

Figure 7:
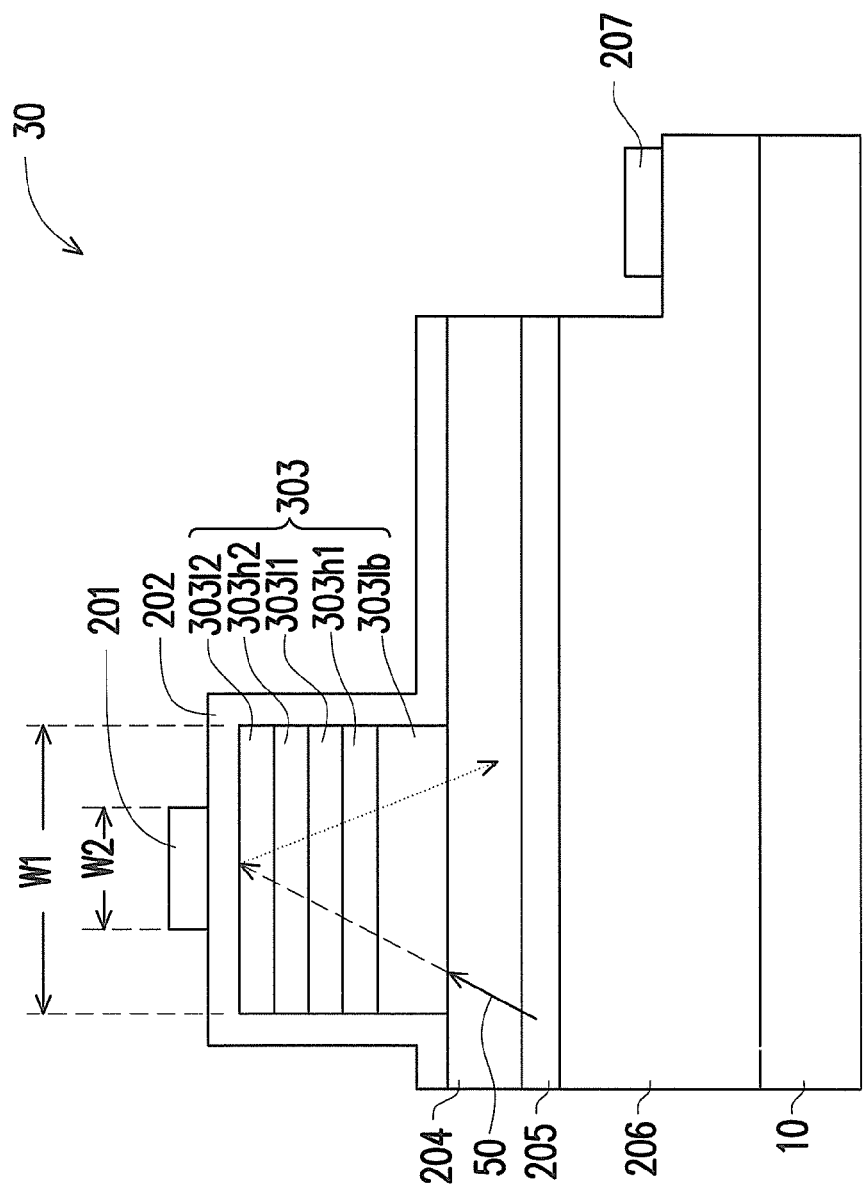
FIG. 7 shows a schematic view of light path of the light-emitting diode chip show in FIG. 6.

Refer to FIG. 7, which shows a schematic view of light path of the light-emitting diode chip in FIG. 6. As shown in FIG. 7, when part of the light 50 emitted from the light-emitting layer 205 is propagating toward the P-type electrode 201, the part of the light 50 could be reflected by the current blocking layer 303, the transparent conductive layer 202 and the P-type electrode 201. On the other hand, refer to FIG. 8, which shows another schematic view of light path of the light-emitting diode chip in FIG. 6. As shown in FIG. 8, when part of the light 60 emitted from the light-emitting layer 205 is propagating toward the neighborhood of the P-type electrode 201, it would be refracted and passing through the current blocking layer 303 and the transparent conductive layer 202. In this way, the light extracting efficiency and luminous efficiency would be enhanced.

According to the above description, please refer to FIG. 9, which shows a ratio of the first width to the second width—enhancement of light output power (LOP) rate curve diagram of the light-emitting diode chip show in FIG. 6. As shown in FIG. 9, in the present embodiment, when the ratio (W1/W2) of the first width W1 to the second width W2 ranges from 1.4 to 2.6, the enhancement of LOP would range from 0.55% to 0.70%. In other words, the luminous efficiency of the LED chip 30 in the present embodiment could be optimized by controlling the ratio (W1/W2) of the first width W1 to the second width W2. It should be noticed that the aforementioned value ranges are only used as an example, and are not used for limiting the invention.

Figure 10:
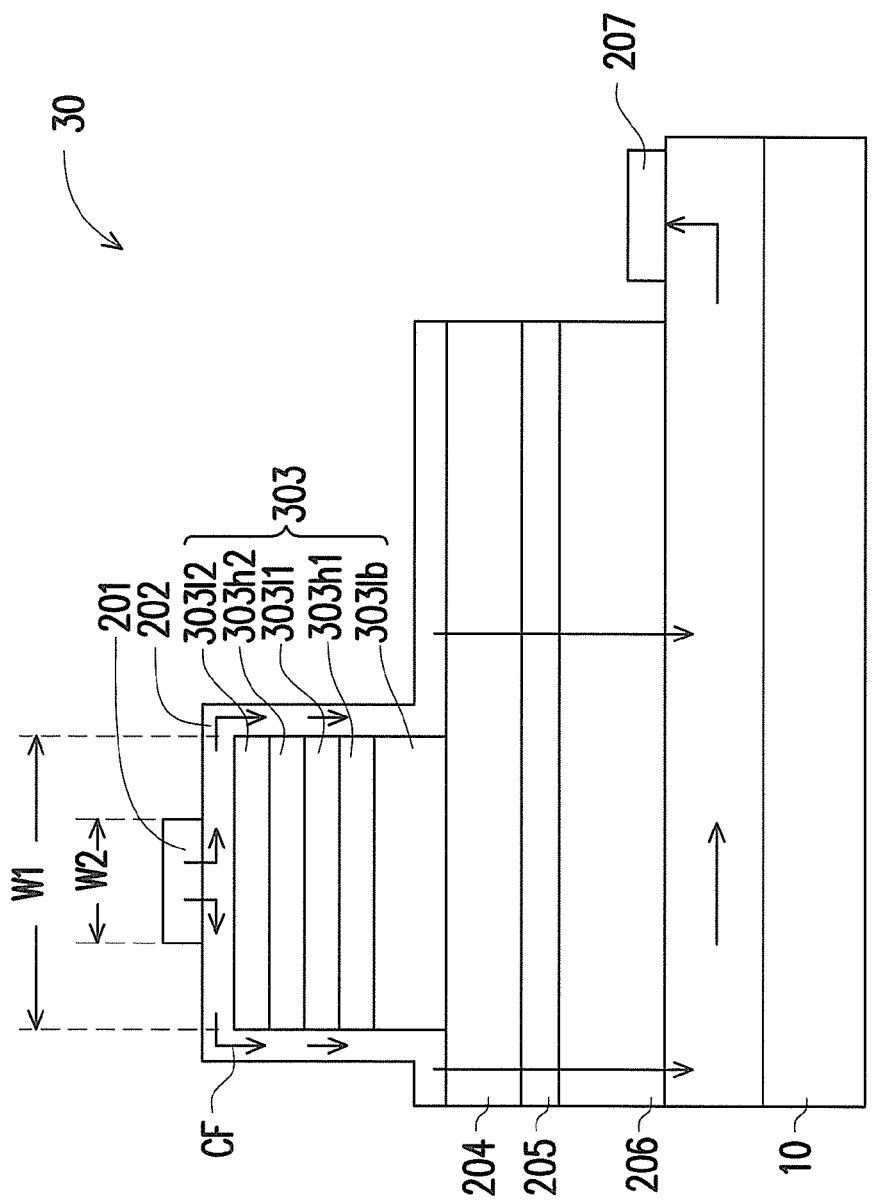
FIG. 10 shows a schematic view of current flow of the light-emitting diode chip show in FIG. 6.

Refer to FIG. 10, which shows a schematic view of current flow of the light-emitting diode chip in FIG. 6. As shown in FIG. 10, when the LED chip 30 illuminates, the current CF provided from the P-type electrode 201 would not flow through the current blocking layer 303 but flow along the transparent conductive layer 202 and be transmitted to the N-type electrode 207 so as to decrease the probability of passing through the part of the light-emitting layer 205 directly under the P-type electrode 201. In this way, the luminous efficiency of the LED chip 30 would be further enhanced.

Figure 11:
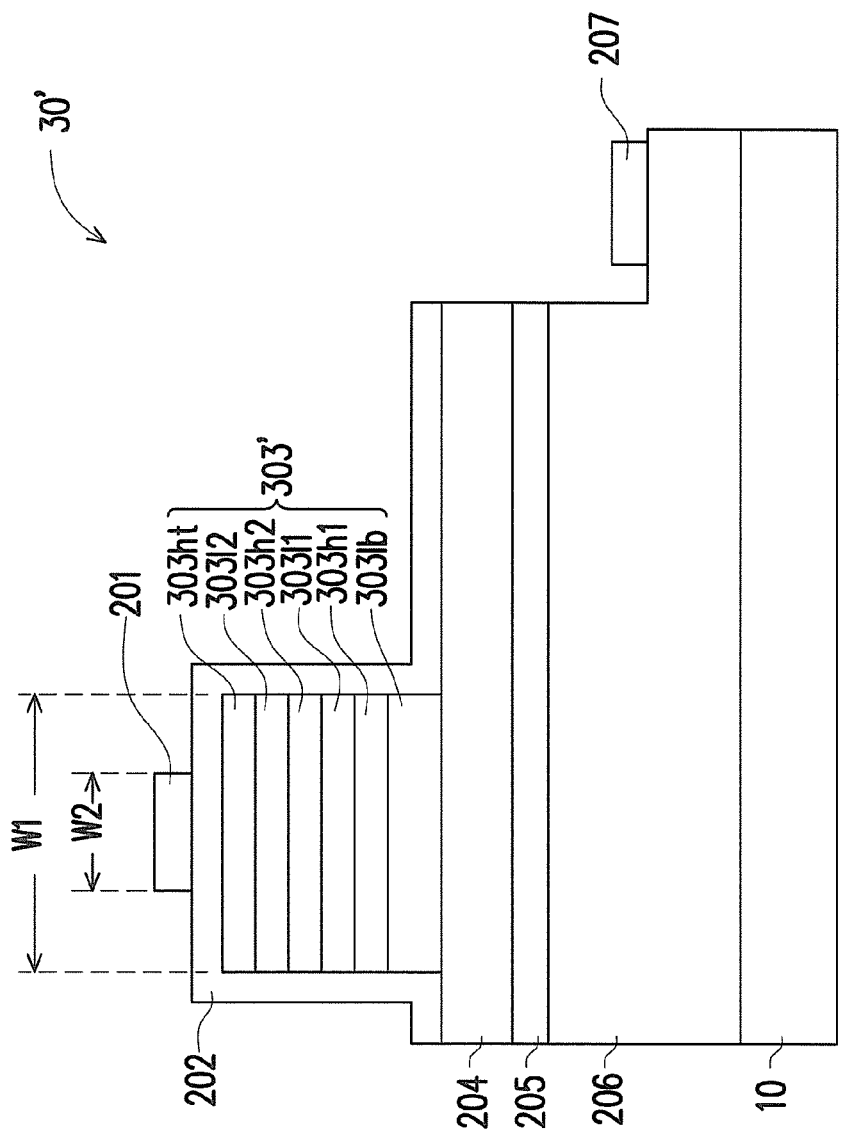
FIG. 11 shows a cross-section view of the light-emitting diode chip according to yet another preferred embodiment of the present invention.

Referring to FIG. 11, which shows a cross-section view of the light-emitting diode chip according to yet another preferred embodiment of the invention. As shown in FIG. 11, the LED chip 30' of the embodiment is similar to the LED chip 30 show in FIG. 6, and differences there between are described as follow. In the embodiment show in FIG. 11, the high refractive index layers of the current blocking layer 303' of the LED chip 30' further comprise a high refractive index top layer 303ht disposed between the second low refractive index layer 303l2 and the transparent conductive layer 202. Moreover, in the present embodiment, the thicknesses of the high refractive index layers 303h1, 303h2 and the high refractive index top layer 303ht are $0.15\lambda/n_h$, the thicknesses of the first low refractive index layer 303l1 and the second low refractive index layer 303l2 are $0.45\lambda/n_l$, the thicknesses of the low refractive index bottom layer 303lb is $0.6\lambda/n_l$.

In this way, the light extracting efficiency and the luminous efficiency of the LED chip 30' could also be enhanced by configuring of the current blocking layer 303' in the present embodiment. Besides, in the present embodiment, the thickness of each of a plurality of high refractive index layers 303h1, 303h2 and 303ht and a plurality of low refractive index layers 303lb, 303l1 and 303l2 is formed with non-integer film stacks. Herein, the non-integer film stacks means that the optical path difference (OPD) between the adjacent refractive index layers of the current blocking layer 303' is not equal to the integer times of the half-wavelength of the light emitted from the light-emitting layer 205. In this way, the reflectivity of the light incident toward the P-type electrode 201 with a small incident angle and the transmittance of the light propagating toward the neighborhood of the P-type electrode 201 would be optimized. Details are described below with reference of FIG. 12 to FIG. 13.

Figure 12:
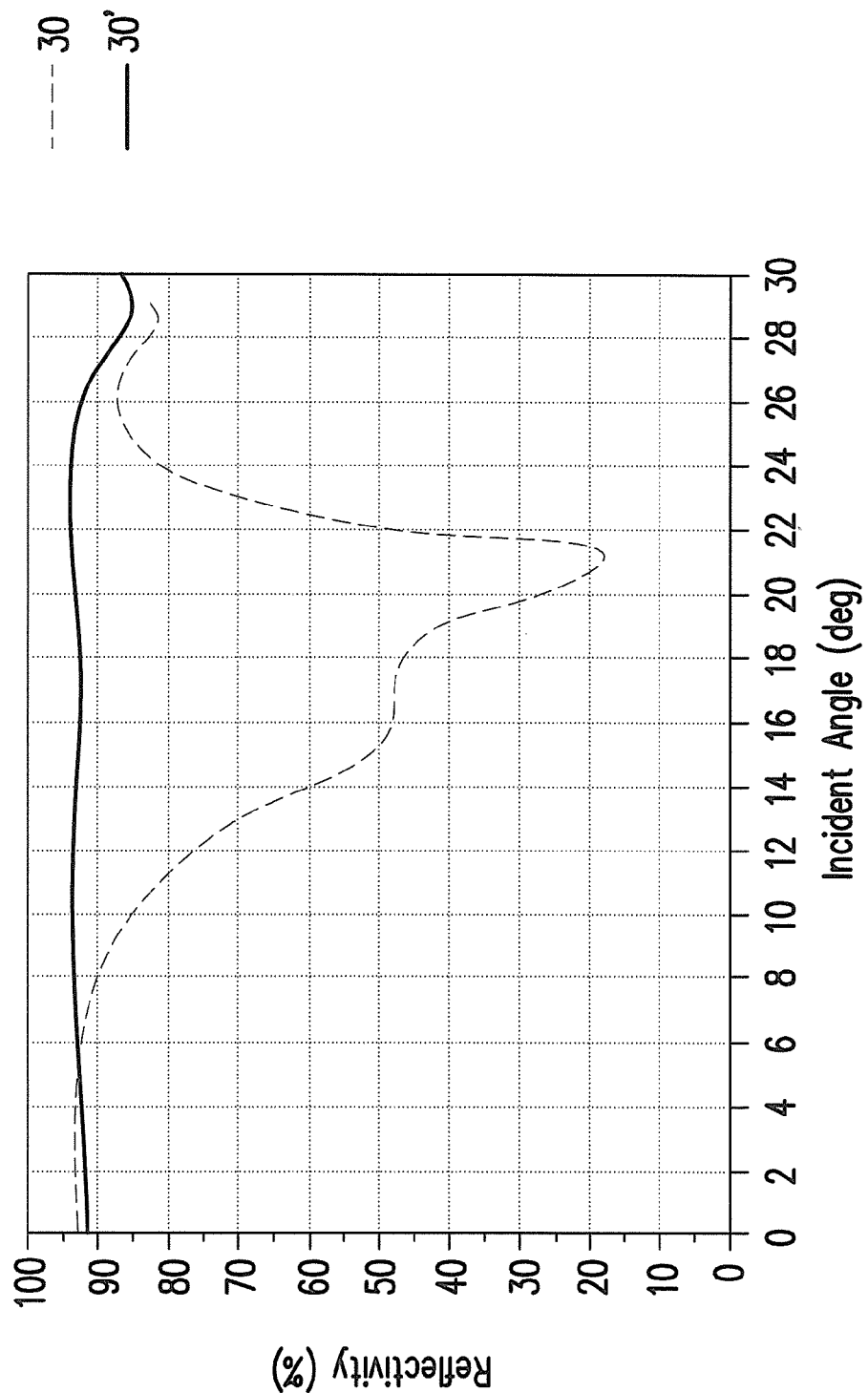
FIG. 12 is an incident angle-reflectivity rate curve diagram of the light-emitting diode chip show in FIG. 6 and FIG. 11.

Referring to FIG. 12, which shows an incident angle-reflectivity rate curve diagram of the light-emitting diode chip show in FIG. 6 and FIG. 11. Similar as the LED chip 30, in the embodiment show in FIG. 11, when part of the light emitted from the light-emitting layer 205 is propagating toward the P-type electrode 201, the part of the light could be reflected by the current blocking layer 303', the transparent conductive layer 202 and the P-type electrode 201. Moreover, as shown in FIG. 12, the reflectivity of the LED chip 30' is higher and more uniform than reflectivity of LED chip 30 when an incident angle of the light propagating toward the P-type electrode 201 ranged from 6 to 30 degrees.

Figure 13:
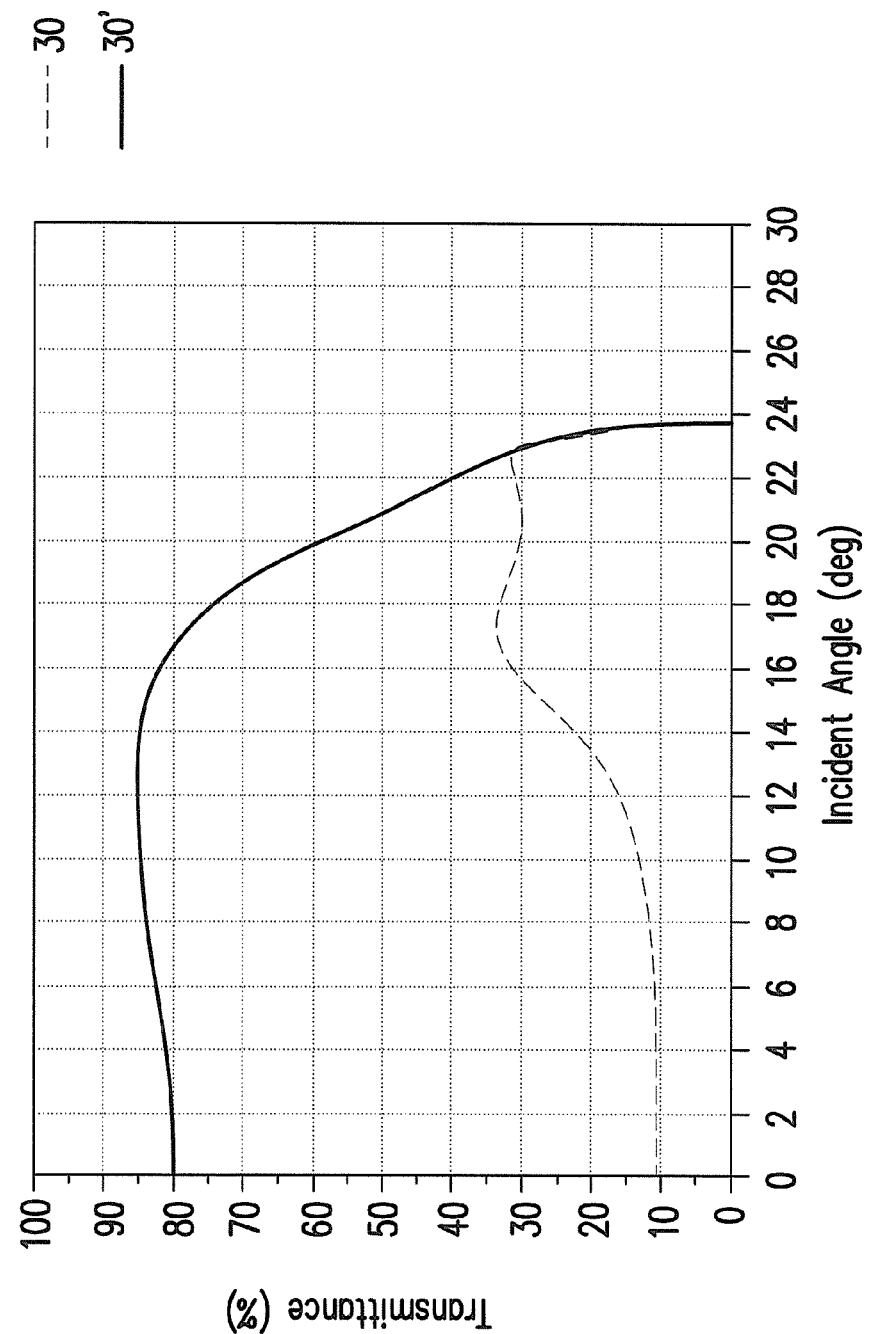
FIG. 13 is an incident angle-transmittance rate curve diagram of the light-emitting diode chip show in FIG. 6 and FIG. 11.

Referring to FIG. 13, which shows an incident angle-transmittance rate curve diagram of the light-emitting diode chip show in FIG. 6 and FIG. 11. Similar as the LED chip 30, in the embodiment show in FIG. 11, when part of the light emitted from the light-emitting layer 205 is propagating toward the neighborhood of the P-type electrode 201, it would be refracted and passing through the current blocking layer 303' and the transparent conductive layer 202 of the LED chip 30'. Moreover, as shown in FIG. 13, the transmittance of the LED chip 30' is higher than transmittance of the LED chip 30 when an incident angle of the light propagating toward the neighborhood of the P-type electrode 201 ranged from 0 to 22 degrees.

To conclude the above, the LED chip of the invention could cause that the reflectivity of the light incident toward the second electrode with a small incident angle and the transmittance of the light propagating toward the neighborhood of the second electrode would be optimized by adjusting the thickness of each of a plurality of high refractive index layers and a plurality of low refractive index layers so as to enhance the light extracting efficiency or the luminous efficiency of the LED chip. Besides, by configuring the current blocking layer and transparent conductive layer, the luminous efficiency and the reliability of the LED chip would be enhanced through preventing the current from passing the light-emitting layer.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A light emitting diode (LED) chip, comprising:
 a first type semiconductor layer;
 a light-emitting layer, disposed on the first type semiconductor layer;
 a second type semiconductor layer, disposed on the light-emitting layer;
 a current blocking layer, disposed on the second type semiconductor layer;
 a transparent conductive layer disposed on the second type semiconductor layer and covered the current blocking layer; and
 an electrode, disposed on the transparent conductive layer corresponding to the current blocking layer;
 wherein the current blocking layer and the electrode respectively have a first width and a second width in a cross section view, and the first width of the current blocking layer is larger than the second width of the electrode,
 wherein the current blocking layer comprises a plurality of high refractive index layers and a plurality of low refractive index layers, and the high refractive index layers and the low refractive index layers are alternately stacked,
 wherein the ratio of the first width to the second width ranges from 1.4 to 2.6.

2. The LED chip according to claim 1, wherein the high refractive index layers comprise a first high refractive index layer and a second high refractive index layer, and the low refractive index layers comprise:
 a low refractive index bottom layer, disposed between the second type semiconductor layer and the first high refractive index layer;
 a first low refractive index layer, disposed between the first high refractive index layer and the second high refractive index layer; and
 a second low refractive index layer, disposed between the second high refractive index layer and the transparent conductive layer.

3. The LED chip according to claim 2, wherein the thickness of the low refractive index bottom layer is larger than the other refractive index layer.

4. The LED chip according to claim 2, wherein the thicknesses of the high refractive index layers are $0.25\lambda/n_h$, the thicknesses of the first low refractive index layer and the second low refractive index layer are $0.25\lambda/n_l$, the thicknesses of the low refractive index bottom layer is $1.75\lambda/n_l$, where $\lambda$ is wavelength of a light emitted from the light-emitting layer, $n_h$ is a refractive index of the high refractive index layer, and $n_l$ is a refractive index of the low refractive index layers.

5. The LED chip according to claim 2, wherein the high refractive index layers further comprise a high refractive index top layer disposed between the second low refractive index layer and the transparent conductive layer.

6. The LED chip according to claim 5, wherein the thicknesses of the high refractive index layers and the high refractive index top layer are $0.15\lambda/n_h$, the thicknesses of the first low refractive index layer and the second low refractive index layer are $0.45\lambda/n_l$, the thicknesses of the low refractive index bottom layer is $0.6\lambda/n_l$, where $\lambda$ is wavelength of a light emitted from the light-emitting layer, $n_l$ is a refractive index of the low refractive index layers, and $n_h$ is a refractive index of the high refractive index layer.

7. The LED chip according to claim 1, wherein a material of the high refractive index layers include titanium dioxide ($TiO_2$).

8. The LED chip according to claim 1, wherein a material of the low refractive index layers include silicon dioxide ($SiO_2$).

9. The LED chip according to claim 1, wherein a material of transparent conductive layer includes an element selected from a group consisting of indium-tin oxide (ITO), zinc oxide (ZnO), indium-gallium oxide (IGO), aluminium doped zinc oxide (AZO), nickel oxide (NiO), ruthenium dioxide ($RuO_2$), and graphene.

10. A light emitting diode (LED) chip, comprising:
 a first type semiconductor layer;
 a light-emitting layer, disposed on the first type semiconductor layer;
 a second type semiconductor layer, disposed on the light-emitting layer;
 a current blocking layer, disposed on the second type semiconductor layer;
 a transparent conductive layer disposed on the second type semiconductor layer and covered the current blocking layer; and
 an electrode, disposed on the transparent conductive layer corresponding to the current blocking layer;
 wherein the current blocking layer comprises a plurality of high refractive index layers and a plurality of low refractive index layers, and the high refractive index layers and the low refractive index layers are alternately stacked, and the number of the high refractive index layers and the number of the low refractive index layers are different.

11. The LED chip according to claim 10, wherein the high refractive index layers comprise a first high refractive index layer and a second high refractive index layer, and the low refractive index layers comprise:
 a low refractive index bottom layer, disposed between the second type semiconductor layer and the first high refractive index layer;
 a first low refractive index layer, disposed between the first high refractive index layer and the second high refractive index layer; and
 a second low refractive index layer, disposed between the second high refractive index layer and the transparent conductive layer.

12. The LED chip according to claim 11, wherein the thickness of the low refractive index bottom layer is larger than the thickness of the first low refractive index layer, the thickness of the second low refractive index layer, the thickness of the first high refractive index layer, and the thickness of the second high refractive index layer.

13. The LED chip according to claim 11, wherein the thicknesses of the high refractive index layers are $0.25\lambda/n_h$, the thicknesses of the first low refractive index layer and the second low refractive index layer are $0.25\lambda/n_l$, the thickness of the low refractive index bottom layer is $1.75\lambda/n_l$, where $\lambda$ is wavelength of a light emitted from the light-emitting layer, $n_h$ is a refractive index of the high refractive index layer, and $n_l$ is a refractive index of the low refractive index layers.

14. A light emitting diode (LED) chip, comprising:
 a first type semiconductor layer;
 a light-emitting layer, disposed on the first type semiconductor layer;

a second type semiconductor layer, disposed on the light-emitting layer;

a current blocking layer, disposed on the second type semiconductor layer;

a transparent conductive layer disposed on the second type semiconductor layer and covered the current blocking layer; and an electrode, disposed on the transparent conductive layer corresponding to the current blocking layer;

wherein the current blocking layer comprises a plurality of high refractive index layers and a plurality of low refractive index layers, and the high refractive index layers and the low refractive index layers are alternately stacked;

wherein the high refractive index layers comprise a first high refractive index layer, a second high refractive index layer and a high refractive index top layer under the transparent conductive layer, and the low refractive index layers comprise:

a low refractive index bottom layer, disposed between the second type semiconductor layer and the first high refractive index layer;

a first low refractive index layer, disposed between the first high refractive index layer and the second high refractive index layer; and a second low refractive index layer, disposed between the second high refractive index layer and the high refractive index top layer; and wherein the thicknesses of the high refractive index layers and the high refractive index top layer are $0.15\lambda/n_h$, the thicknesses of the first low refractive index layer and the second low refractive index layer are $0.45\lambda/n_l$, the thickness of the low refractive index bottom layer is $0.6\lambda/n_l$, where $\lambda$ is wavelength of a light emitted from the light-emitting layer, $n_l$ is a refractive index of the low refractive index layers, and $n_h$ is a refractive index of the high refractive index layer.

* * * * *